(12) United States Patent
Heo et al.

(10) Patent No.: US 12,119,060 B2
(45) Date of Patent: Oct. 15, 2024

(54) CONTENT-ADDRESSABLE MEMORY AND ELECTRONIC DEVICE INCLUDING THE SAME

(71) Applicant: Samsung Electronics Co., Ltd., Suwon-si (KR)

(72) Inventors: Jinseong Heo, Suwon-si (KR); Hagyoul Bae, Suwon-si (KR); Seunggeol Nam, Suwon-si (KR); Hyunjae Lee, Seoul (KR); Dukhyun Choe, Hanam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 65 days.

(21) Appl. No.: 17/953,491

(22) Filed: Sep. 27, 2022

(65) Prior Publication Data
US 2023/0099577 A1  Mar. 30, 2023

(30) Foreign Application Priority Data

Sep. 27, 2021 (KR) .................... 10-2021-0127544
Jun. 28, 2022 (KR) .................... 10-2022-0079267

(51) Int. Cl.
*G11C 15/04* (2006.01)

(52) U.S. Cl.
CPC .................... *G11C 15/04* (2013.01)

(58) Field of Classification Search
CPC .................... G11C 15/04; G11C 15/046
USPC .......................... 365/49.1, 230.03
See application file for complete search history.

(56) References Cited

U.S. PATENT DOCUMENTS

| 5,146,300 A   | * | 9/1992  | Hamamoto | H10B 12/00 |
|---------------|---|---------|----------|------------|
|               |   |         |          | 438/210    |
| 6,483,733 B2  | * | 11/2002 | Lines    | G11C 15/04 |
|               |   |         |          | 711/108    |
| 6,563,727 B1  | * | 5/2003  | Roth     | G11C 15/00 |
|               |   |         |          | 365/206    |
| 8,582,338 B1  | * | 11/2013 | Argyres  | G11C 15/04 |
|               |   |         |          | 365/49.1   |
| 8,625,320 B1  | * | 1/2014  | Argyres  | G11C 15/04 |
|               |   |         |          | 365/49.1   |
| 9,685,215 B1  |   | 6/2017  | Kang et al. |         |
| 10,692,935 B2 |   | 6/2020  | Kwon et al. |         |
| 10,854,611 B2 |   | 12/2020 | Mathew et al. |       |

(Continued)

FOREIGN PATENT DOCUMENTS

| CN | 109155310 A     |   | 1/2019  |            |
|----|-----------------|---|---------|------------|
| EP | 3675127 A1      | * | 7/2020  | G11C 15/04 |

(Continued)

OTHER PUBLICATIONS

Kai Ni et al., "Ferroelectric ternary content-addressable memory for one-shot learning" *Nature Electronics*, vol. 2, Nov. 2019, pp. 521-529.

(Continued)

*Primary Examiner* — Michael T Tran
(74) *Attorney, Agent, or Firm* — HARNESS, DICKEY & PIERCE, P.L.C.

(57) ABSTRACT

Provided is a content-addressable memory. The content-addressable memory may include a memory cell connected to a match line, a word line, and a search line, and the memory cell includes a first channel layer and a second channel layer doped with different dopants.

20 Claims, 11 Drawing Sheets

(56) References Cited

U.S. PATENT DOCUMENTS

| | | | |
|---|---|---|---|
| 11,107,515 B2 | 8/2021 | Derner et al. | |
| 2007/0247885 A1* | 10/2007 | Watanabe | G11C 7/14 |
| | | | 365/49.17 |
| 2013/0135914 A1* | 5/2013 | Kohli | G11C 11/412 |
| | | | 365/49.11 |
| 2016/0104532 A1* | 4/2016 | Petti | H10B 63/84 |
| | | | 365/49.17 |
| 2016/0203868 A1* | 7/2016 | Wang | G11C 15/046 |
| | | | 365/49.17 |
| 2016/0247569 A1* | 8/2016 | Nii | G11C 15/04 |
| 2016/0300614 A1* | 10/2016 | Nebashi | G11C 11/1675 |
| 2017/0236585 A1* | 8/2017 | Matsuoka | G11C 15/04 |
| | | | 365/49.17 |
| 2018/0040374 A1* | 2/2018 | Zheng | G11C 15/046 |
| 2018/0068708 A1* | 3/2018 | Nii | G11C 15/04 |
| 2020/0006383 A1 | 1/2020 | Petti | |
| 2021/0280250 A1* | 9/2021 | Advani | G11C 16/0483 |
| 2021/0343341 A1* | 11/2021 | Strachan | G11C 15/046 |

FOREIGN PATENT DOCUMENTS

| | | |
|---|---|---|
| EP | 3882212 A1 | 9/2021 |
| KR | 2017/0112635 A | 10/2017 |
| KR | 2018/0058673 A | 6/2018 |
| KR | 102227270 B1 | 3/2021 |
| WO | WO-2008/134688 A1 | 11/2008 |
| WO | WO-2020/005324 A1 | 1/2020 |

OTHER PUBLICATIONS

Can Li et al., "Analog content-addressable memories with memristors" *Nature Communications*, vol. 11, p. 1638, 2020.

Extended European Search Report dated Jan. 30, 2023, issued in corresponding European Patent Application No. 22198009.7.

* cited by examiner

CONTENT-ADDRESSABLE MEMORY AND ELECTRONIC DEVICE INCLUDING THE SAME

CROSS-REFERENCE TO RELATED APPLICATIONS

This application is based on and claims priority under 35 U.S.C. § 119 to Korean Patent Application Nos. 10-2021-0127544 and 10-2022-0079267, respectively filed on Sep. 27, 2021 and Jun. 28, 2022, in the Korean Intellectual Property Office, the disclosures of each of which are incorporated by reference herein in their entirety.

BACKGROUND

1. Field

The present disclosure relates to a content-addressable memory and an electronic device including the same.

2. Description of the Related Art

In general, a content-addressable memory (CAM) includes a static random-access memory (SRAM). Because the SRAM includes 16 transistors, the area of a memory cell may be large. Accordingly, in order to reduce the area of a memory cell, a structure using a resistive storage such as a resistive random-access memory (ReRAM) or a spin-transfer torque magnetic random-access memory (STT-MRAM) has been proposed.

When a CAM is a ternary content-addressable memory (TCAM), an inverter for signal mirroring in a memory cell may be required in addition to transistors. Because the inverter may not be implemented as a complementary metal-oxide-semiconductor (CMOS) inverter having a simple structure, a complex circuit may be required. Accordingly, there may be a limitation in reducing the size of the CAM.

SUMMARY

Provided is a content-addressable memory not requiring inverters, and an electronic device including the content-addressable memory.

Provided is a content-addressable memory with a small area and an electronic device including the same.

Additional aspects will be set forth in part in the description which follows and, in part, will be apparent from the description, or may be learned by practice of the presented embodiments.

According to an example embodiment, a content-addressable memory may include a match line extending in a first direction; a word line spaced apart from the match line, the word line extending parallel to the first direction; a search line spaced apart from the match line and the word line; and a plurality of memory cells respectively connected to the match line, the word line, and the search line. At least one of the plurality of memory cells may include a source electrode and a drain electrode spaced apart from each other; a first channel layer and a second channel layer doped with different dopants, the first channel layer and the second channel layer between the source electrode and the drain electrode such that a first end of the first channel layer and a first end of the second channel layer contact the source electrode and a second end of the first channel layer and a second end of the second channel layer contact the drain electrode; and a gate electrode spaced apart from all of the first channel layer, the second channel layer, the source electrode, and the drain electrode.

In some embodiments, the content-addressable memory may further include a substrate. The source electrode and the drain electrode may be located on the substrate and may be spaced apart from each other in a direction parallel to a surface of the substrate, and the first channel layer and the second channel layer may be located on the substrate and may be spaced apart from each other in a thickness direction of the substrate.

In some embodiments, a ratio of a charge mobility of the second channel layer to a charge mobility of the first channel layer may be equal to or greater than 0.9 and equal to or less than 1.1.

In some embodiments, one of the first channel layer and the second channel layer may be doped with an n-type dopant, and an other of the first channel layer and the second channel layer may be doped with a p-type dopant.

In some embodiments, a doping concentration of the p-type dopant in the other of the first channel layer and the second channel layer may be equal to or greater than a doping concentration of the n-type dopant in the one of the first channel layer and the second channel layer.

In some embodiments, the first channel layer, the second channel layer, or both the first channel layer and the second channel layer may include at least one of silicon (Si), germanium (Ge), a thin-film semiconductor (e.g., an oxide semiconductor such as indium gallium zinc oxide (IGZO)), a group III-V material, a two-dimensional (2D) material, transition metal dichalcogenide, quantum dots (QDs) (e.g., colloidal QDs or nanocrystals), and an organic material.

In some embodiments, a base material of the first channel layer and a base material of the second channel layer may include a same material.

In some embodiments, the memory cell may further include a first gate insulating layer surrounding the first channel layer, and a second gate insulating layer surrounding the second channel layer. The first gate insulating layer and the second gate insulating layer may be spaced apart from each other with a portion of the gate electrode therebetween.

In some embodiments, at least one of the first gate insulating layer and the second gate insulating layer may include a ferroelectric material.

In some embodiments, ferroelectric material may include a material represented as $MO_2$ (where M is Hf, Zr, or a combination thereof) and M is a base material.

In some embodiments, at least one of the first gate insulating layer and the second gate insulating layer may further include at least one dopant material selected from C, Si, Ge, Sn, Pb, Al, Y, La, Gd, Mg, Ca, Sr Ba, Ti, Zr, Hf, and a combination thereof.

In some embodiments, at least one of the first gate insulating layer and the second gate insulating layer may include a first layer including a paraelectric material, and a second layer including a ferroelectric material.

In some embodiments, the paraelectric material may include an oxide of a material included in at least one of the first channel layer and the second channel layer.

In some embodiments, the paraelectric material may include at least one of SiO, AlO, SiON, and SiN.

In some embodiments, the gate electrode may include a first gate electrode surrounding the first gate insulating layer, and a second gate electrode surrounding the second gate insulating layer.

In some embodiments, the first gate electrode and the second gate electrode may contact each other.

In some embodiments, the first gate electrode and the second gate electrode may be spaced apart from each other by an insulating layer.

In some embodiments, the insulating layer may include a paraelectric material.

In some embodiments, the word line may be connected to the source electrode, the match line may be connected to the drain electrode, and the search line may be connected to the gate electrode.

According to an example embodiment, a content-addressable memory may include a plurality of memory cells and a plurality of wirings connected to a corresponding one of the plurality of memory cells. The plurality of memory cells each may include a first transistor and a second transistor sharing a source electrode and a drain electrode. The first transistor may include a first channel layer and a first gate insulating layer surrounding the first channel layer. The first channel layer may have a first side opposite a second side. The first side may be connected to the source electrode and the second side may be connected to the drain electrode. The first channel layer may be doped with a first dopant. The transistor may include a second channel layer and a second gate insulating layer surrounding the second channel layer. The second channel layer may have a first end opposite a second end. The first end may be connected to the source electrode and the second side may be connected to the drain electrode. The second channel layer may be doped with a second dopant that may be a different conductivity type than the first dopant. The plurality of memory cells each may include a single gate electrode or a pair of gate electrodes connected to the first gate insulating layer and the second gate insulating layer and spaced apart from the source electrode and the drain electrode. The single gate electrode or the pair of gate electrodes may be separated from the first channel layer and the second channel layer by the first gate insulating layer and the second gate insulating layer, respectively. The plurality of wirings may include a first wiring connected to the source electrode, a second wiring connected to the drain electrode, and one of a third wiring connected to the single gate electrode or a pair of sub-wirings connected to the pair of gate electrodes.

In some embodiments, the first channel layer, the second channel layer, or both the first channel layer and the second channel layer independently may include at least one of silicon (Si), germanium (Ge), an oxide semiconductor, a group III-V material, a two-dimensional (2D) material, a transition metal dichalcogenide, quantum dots (QDs), and an organic material. At least one of the first gate insulating layer and the second gate insulating layer may include a ferroelectric material.

In some embodiments, the plurality of memory cells each may include the single gate electrode. The plurality of wirings may include the third wiring connected to the single gate electrode.

The plurality of memory cells each may include the pair of gate electrodes. The plurality of wirings may include the pair of sub-wirings connected to the pair of gate electrodes.

An electronic device may include one of the above-discussed content-addressable memories.

BRIEF DESCRIPTION OF THE DRAWINGS

The above and other aspects, features, and advantages of certain embodiments will be more apparent from the following description taken in conjunction with the accompanying drawings, in which.

DETAILED DESCRIPTION

Figure 1:
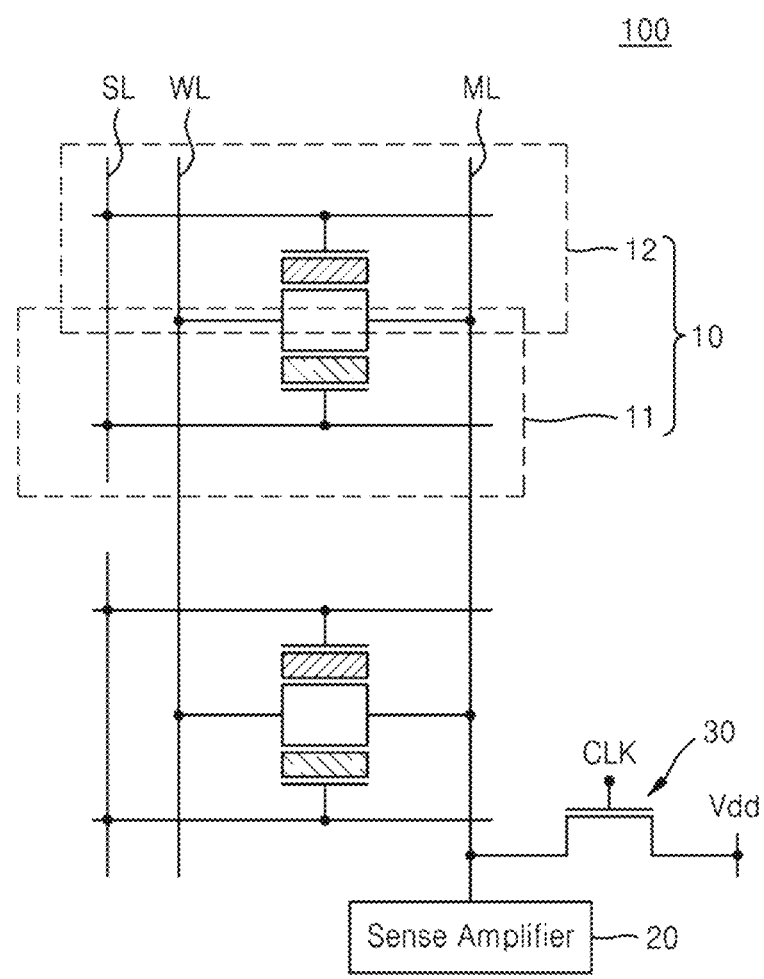
FIG. 1 is a circuit diagram illustrating a content-addressable memory, according to an embodiment.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list. For example, "at least one of A, B, and C," and similar language (e.g., "at least one selected from the group consisting of A, B, and C") may be construed as A only, B only, C only, or any combination of two or more of A, B, and C, such as, for instance, ABC, AB, BC, and AC.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Embodiments will be described in detail with reference to the attached drawings. The embodiments described below are merely examples, and various modifications may be made from the embodiments. Like reference numerals denote like elements throughout, and in the drawings, sizes of elements may be exaggerated for clarity and convenience of explanation.

When an element is referred to as being "on" another element, it may be directly on the other element, or intervening elements may be present therebetween.

While such terms as "first," "second," etc., may be used to describe various components, the above terms are used only to distinguish one component from another. The terms do not mean that materials or structures of elements are different.

The singular forms "a," "an," and "the" are intended to include the plural forms as well, unless the context clearly indicates otherwise. When a portion "includes" an element, another element may be further included, rather than excluding the existence of the other element, unless otherwise described.

The term used in the embodiments such as "unit" or "module" indicates a unit for processing at least one function or operation, and may be implemented in hardware, software, or in a combination of hardware and software.

The use of the terms "a" and "an," and "the" and similar referents in the context of describing the disclosure is to be construed to cover both the singular and the plural.

The use of any and all examples, or example language (e.g., "such as") provided herein, is intended merely to better illuminate the disclosure and does not pose a limitation on the scope of the disclosure unless otherwise claimed.

FIG. 1 is a circuit diagram illustrating a content-addressable memory, according to an embodiment.

Referring to FIG. 1, a content-addressable memory 100 may include a plurality of memory cells 10. In the content-addressable memory 100, the plurality of memory cells 10 may be continuously arranged in a first direction and a second direction. The first direction may be an x-axis direction. The second direction may be a y-axis direction. Accordingly, the plurality of memory cells 10 may constitute a cell array. In an example, each memory cell 10 may include first and second transistors 11 and 12. The term 'transistor' may be a field effect transistor.

The first and second transistors 11 and 12 of the memory cell 10 may reduce the area of the memory cell 10 by sharing at least one of a source electrode, a drain electrode, and a gate electrode. For example, the first and second transistors 11 and 12 may share a source electrode 120 and a drain electrode 130. A structure of the memory cell 10 will be described below.

The first and second transistors 11 and 12 of the memory cell 10 may be of different types. In an example, the first transistor 11 may be a pMOS-type transistor, and the second transistor 12 may be an nMOS-type transistor.

The two transistors, that is, the first and second transistors 11 and 12, included in the memory cell 10 may be connected to first through third wirings WL, ML, and SL. In an example, a first terminal, for example, a source electrode, of the first and second transistors 11 and 12 of the memory cell 10 may be connected to the first wiring WL, and a second terminal, for example, a drain electrode, may be connected to the second wiring ML. A third terminal, for example, a gate electrode 150, of the first and second transistors 11 and 12 may be connected to the third wiring SL. The first wiring WL may be a word line. The second wiring ML may be a match line. The third wiring SL may be a search line.

The first and second wirings WL and ML may extend parallel to each other with the first and second transistors 11 and 12 therebetween. The third wiring SL may be spaced apart from the first and second wirings WL and ML. In the content-addressable memory, a sense amplifier 20 is connected to an end of the second wiring ML. A voltage signal transmitted through the second wiring ML may be amplified by the sense amplifier 20. In the second wiring ML, a transistor 30 is connected between the sense amplifier 20 and the memory cell 10 adjacent to the sense amplifier 20. The transistor 30 may be a transistor that regulates a voltage between a power supply voltage VDD and the second wiring ML.

In an operation of the content-addressable memory, a write voltage and a read (search) voltage may be applied through the third wiring SL. The memory cell 10 may be selected, by selecting the first wiring WL and the third wiring SL.

Figure 2:
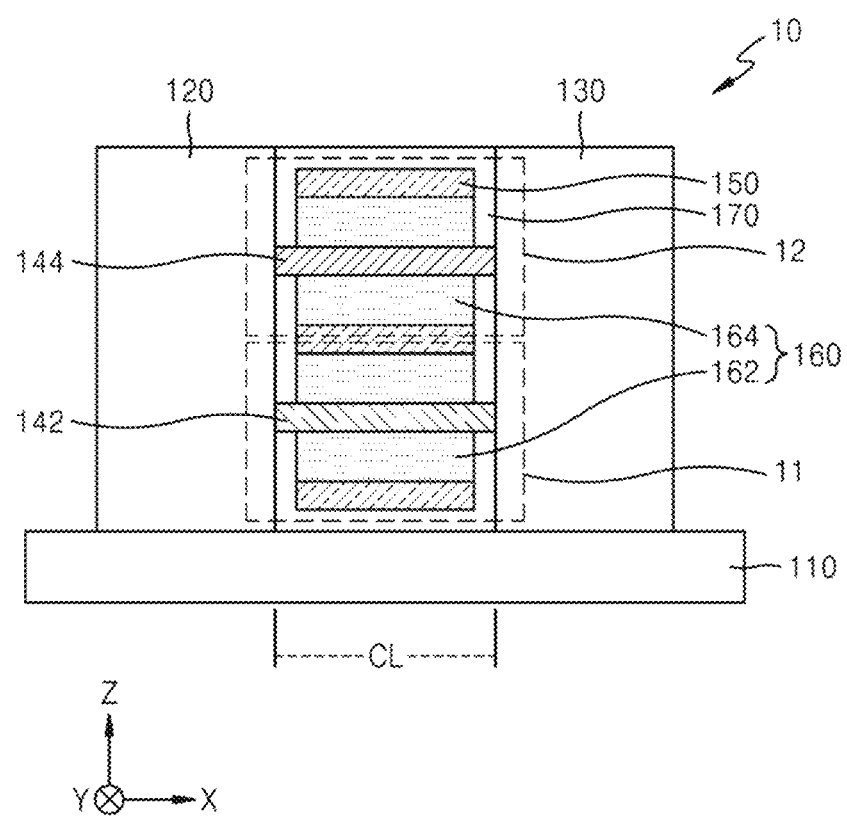
FIG. 2 is a view illustrating a cross-section of a memory cell of FIG. 1.
Figure 3:
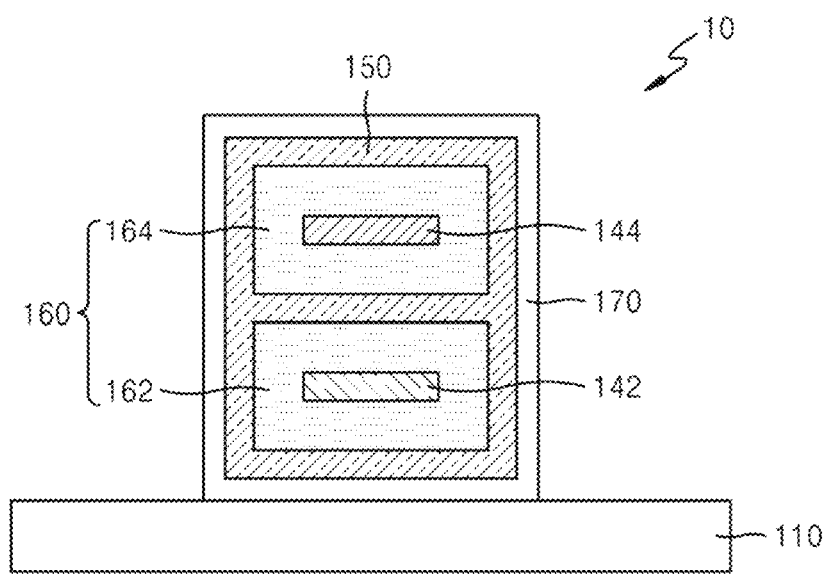
FIG. 3 is a view illustrating another cross-section of the memory cell of FIG. 1.

FIG. 2 is a view illustrating a cross-section of the memory cell 10 of FIG. 1. FIG. 3 is a view illustrating another cross-section of the memory cell 10 of FIG. 1. Referring to FIGS. 2 and 3, the memory cell 10 of the content-addressable memory may include a substrate 110, and the source electrode 120 and the drain electrode 130 located on the substrate 110 and spaced apart from each other in a direction parallel to a surface of the substrate 110.

The substrate 110 may be an insulating substrate, or a semiconductor substrate having a surface on which an insulating layer is formed. When the substrate 110 is a semiconductor substrate, the substrate 110 may include, for example, Si, Ge, SiGe, or a group III-V semiconductor material. The substrate 110 may be, for example, but is not limited to, a silicon substrate having a surface on which silicon oxide is formed.

Each of the source electrode 120 and the drain electrode 130 may include a metal material having excellent electrical conductivity. For example, each of the source electrode 120 and the drain electrode 130 may be formed of a metal such as magnesium (Mg), aluminum (Al), scandium (Sc), titanium (Ti), vanadium (V), chromium (Cr), manganese (Mn), nickel (Ni), copper (Cu), zinc (Zn), gallium (Ga), zirconium (Zr), niobium (Nb), molybdenum (Mo), lead (Pd), silver (Ag), cadmium (Cd), indium (In), tin (Sn), lanthanum (La), hafnium (Hf), tantalum (Ta), tungsten (W), iridium (Ir), platinum (Pt), gold (Au), or bismuth (Bi), or an alloy thereof.

The memory cell 10 may further include a first channel layer 142 and a second channel layer 144 located between the source electrode 120 and the drain electrode 130 and spaced apart from each other in a thickness direction of the substrate 110. The direction parallel to the surface of the substrate 110 may be an X-axis direction, and the thickness direction of the substrate 110 may be a Z-axis direction.

The first channel layer 142 and the second channel layer 144 may have a multi-bridge shape in which both ends of the first channel layer 142 and the second channel layer 144 contact the source electrode 120 and the drain electrode 130 and the first channel layer 142 and the second channel layer 144 are stacked to be spaced apart from each other away from the substrate 110. The channel having the multi-bridge shape may reduce a short channel effect and may reduce the area occupied by the source electrode 120 and the drain electrode 130, and thus, may be advantageous for high integration. Also, because uniform source/drain junction capacitance may be maintained regardless of a position of the channel, the channel having the multi-bridge shape may be applied to a high-speed and high-reliability device.

At least one of the first channel layer 142 and the second channel layer 144 may include a two-dimensional semiconductor material. The two-dimensional semiconductor material may refer to a semiconductor material having a two-dimensional crystal structure, and may have a monolayer or multilayer structure. Each of layers constituting the two-dimensional semiconductor material may have an atomic-level thickness. A thickness of each of the first channel layer 142 and the second channel layer 144 may be about 10 nm or less. However, the disclosure is not limited thereto, and in order to have a short channel length CL, a thickness of a channel layer may be further reduced.

Because the first channel layer 142 and the second channel layer 144 use a two-dimensional semiconductor material, a shorter channel length may be achieved. The term 'channel length' refers to a length of a channel layer between the source electrode 120 and the drain electrode 130, that is, as shown in FIG. 2, a length in the first direction (X direction). The channel length may be related to a thickness of the channel layer, and may be set to a minimum length determined by the thickness of the channel layer. The thickness refers to a thickness in a stacking direction, that is, in the second direction (Z direction).

A thickness of each of the first channel layer 142 and the second channel layer 144 may be 5 nm or less. A thickness of each of the first channel layer 142 and the second channel layer 144 may be 1 nm or less, and in this case, the channel length CL of each of the first channel layer 142 and the second channel layer 144 may be 3 nm or less.

Because the two-dimensional semiconductor material has excellent electrical properties and maintains high mobility without significantly changing its properties even when a thickness is reduced to nano-scale, the two-dimensional semiconductor material may be applied to various devices.

The two-dimensional semiconductor material may include at least one of, for example, graphene, black phosphorus, and transition metal dichalcogenide (TMD). The graphene is a material having a hexagonal honeycomb structure in which carbon atoms are two-dimensionally bonded has higher mobility and excellent thermal properties than silicon (Si), is chemically stable, and has a wide surface area. The black phosphorus is a material in which black phosphorus atoms are two-dimensionally bonded.

The TMD may include one transition metal from among Mo, W, Nb, V, Ta, Ti, Zr, Hf, Tc, and Re and one chalcogen element from among S, Se, and Te. The TMD may be represented as, for example, $MX_2$, where M denotes a transition metal and X denotes a chalcogen element. For example, M may be Mo, W, Nb, V, Ta, Ti, Zr, Hf, Tc, or Re, and X may be S, Se, or Te. Accordingly, examples of the TMD may include $MoS_2$, $MoSe_2$, $MoTe_2$, $WS_2$, $WSe_2$, $WTe_2$, $ZrS_2$, $ZrSe_2$, $HfS_2$, $HfSe_2$, $NbSe_2$, and $ReSe_2$. Alternatively, the TMD may not be represented as $MX_2$. In this case, for example, the TMD may include CuS that is a compound of Cu that is a transition metal and S that is a chalcogen element. The TMD may be a chalcogenide material including a non-transition metal. Examples of the non-transition metal may include Ga, In, Sn, Ge, and Pb. In this case, the TMD may include a compound of a non-transition metal such as Ga, In, Sn, Ge, or Pb and a chalcogen element such as S, Se, or Te. Examples of the TMD may include $SnSe_2$, GaS, GaSe, GaTe, GeSe, $In_2Se_3$, and $InSnS_2$.

As described above, the TMD may include one metal element from among Mo, W, Nb, V, Ta, Ti, Zr, Hf, Tc, Re, Cu, Ga, In, Sn, Ge, and Pb and one chalcogen element from among S, Se, and Te. However, the above materials are merely examples, and other materials may be used as TMD materials.

The two-dimensional semiconductor material may be doped with a p-type dopant or an n-type dopant in order to adjust mobility. The p-type dopant and the n-type dopant may be a p-type dopant and an n-type dopant used for, for example, graphene or carbon nanotubes (CNT). The p-type dopant or the n-type dopant may be doped by using ion implantation or chemical doping.

The first channel layer 142 and the second channel layer 144 according to an embodiment may be doped with different dopants. For example, the first channel layer 142 may be doped with a p-type dopant, and the second channel layer 144 may be doped with an n-type dopant. Alternatively, the first channel layer 142 may be doped with an n-type dopant, and the second channel layer 144 may be doped with a p-type dopant.

In order to increase the signal mirroring effect of the memory cell 10, a charge mobility of the second channel layer 144 with respect to a charge mobility of the first channel layer 142 may be equal to or greater than about 0.9 and equal to or less than 1.1.

Base materials of the first channel layer 142 and the second channel layer 144 may include the same material, and doping concentrations of the first channel layer 142 and the second channel layer 144 may be the same. However, the disclosure is not limited thereto.

Because materials of a p-type dopant and an n-type dopant are different from each other, even when doping concentrations of the p-type dopant and the n-type dopant are the same, a charge mobility of the first channel layer 142 and a charge mobility of the second channel layer 144 may be different from each other. In order to reduce and/or minimize a difference between a charge mobility of the first channel layer 142 and a charge mobility of the second channel layer 144, doping concentrations of the first channel layer 142 and the second channel layer 144 and dimensions of the first channel layer 142 and the second channel layer 144 may be adjusted.

For example, because a charge mobility of a channel layer doped with a p-type dopant is less than a charge mobility of a channel layer doped with an n-type dopant, the first channel layer 142 and the second channel layer 144 may be doped with dopants so that a doping concentration of the p-type dopant is equal to or greater than a doping concentration of the n-type dopant.

Because the first channel layer 142 and the second channel layer 144 are doped with different dopants, the first channel layer 142 and the second channel layer 144 may operate as channel layers of different transistors. For example, the first channel layer 142 may be a channel layer of the first transistor 11 of FIG. 1 and the second channel layer 144 may be a channel layer of the second transistor 12 of FIG. 1.

The memory cell 10 may further include the gate electrode 150 that is spaced apart from all of the source electrode 120, the drain electrode 130, the first channel layer 142, and the second channel layer 144.

The gate electrode 150 may include a metal material or a conductive oxide. The metal material may include at least one selected from the group consisting of, for example, Au, Ti, TiN, TaN, W, Mo, WN, Pt, and Ni. The conductive oxide may include, for example, indium tin oxide (ITO) or indium zinc oxide (IZO). The gate electrode 150 may be formed of the same material as that of the source electrode 120 and the drain electrode 130.

The memory cell 10 may further include a gate insulating layer 160 located between the first channel layer 142 and the gate electrode 150 and between the second channel layer 144 and the gate electrode 150. For example, the gate insulating layer 160 may include a first gate insulating layer 162 surrounding the first channel layer 142 and a second gate insulating layer 164 surrounding the second channel layer 144. The first gate insulating layer 162 and the second gate insulating layer 164 may be spaced apart from each other by the gate electrode 150.

The gate insulating layer 160 may include a ferroelectric material. For example, at least one of the first gate insulating layer 162 and the second gate insulating layer 164 may include a ferroelectric material. The ferroelectric material has a spontaneous electric dipole due to a non-centrosymmetric charge distribution in a crystallized material structure, that is, a spontaneous polarization. Accordingly, the ferroelectric material has a remnant polarization due to the dipole, even with no external electric field. Also, a polarization direction may be switched due to an external electric field in units of domains. The ferroelectric material may include at least one oxide selected from among, but not limited to, Hf, Si, Al, Zr, Y, La, Gd, and Sr. Also, the ferroelectric material may further include a dopant, when necessary.

Because the gate insulating layer 160 includes the ferroelectric material to reduce a subthreshold swing due to a negative capacitance effect, the size of the content-addressable memory may be reduced and performance may be improved.

Alternatively, the gate insulating layer 160 may include a paraelectric material. For example, at least one of the first gate insulating layer 162 and the second gate insulating layer 164 may include a paraelectric material. The gate insulating layer 160 may include at least one of, for example, but not limited to, SiO, AlO, SiON, and SiN.

An insulating layer 170 may be filled between the source electrode 120, the drain electrode 130, and the gate electrode 150. The insulating layer may include a paraelectric material.

The source electrode 120, the drain electrode 130, the first channel layer 142, and the gate electrode 150 may constitute the first transistor 11, and the source electrode 120, the drain electrode 130, the second channel layer 144, and the gate electrode 150 may constitute the second transistor 12. As described above, because a plurality of transistors, for example, the first and second transistors 11 and 12, are vertically stacked on the substrate 110 in one transistor area, a degree of integration of the memory cell 10 may be increased.

Figure 4:
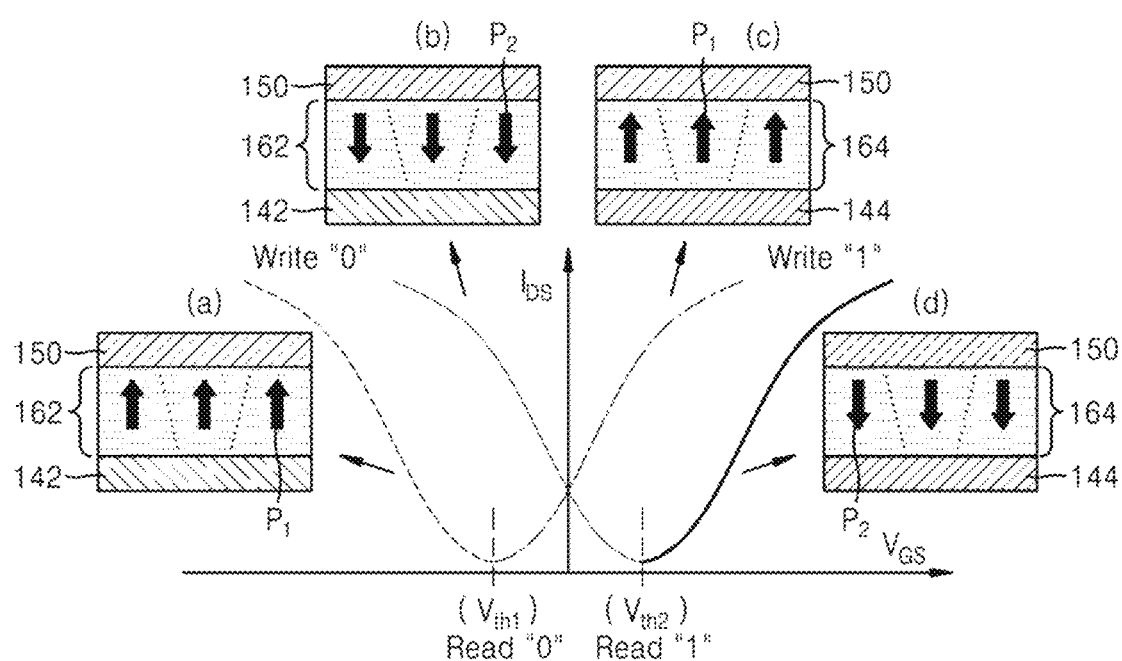
FIG. 4 is a graph schematically showing current-voltage characteristics of a memory cell, according to an embodiment.

FIG. 4 is a graph schematically showing current-voltage characteristics of the memory cell 10, according to an embodiment. Because each of the first and second gate insulating layers 162 and 164 of the memory cell 10 according to an embodiment includes a ferroelectric material, the memory cell 10 may have a current-voltage that varies according to a polarization state of the ferroelectric material and may have a plurality of threshold voltages $V_{th1}$ and $V_{th2}$. From among the plurality of threshold voltages, the lower threshold voltage $V_{th1}$ has a negative value, and the higher threshold voltage $V_{th2}$ has a positive value.

In FIG. 4, (a) illustrates current characteristics of source-drain due to a channel layer doped with a p-type dopant, when a polarization direction of a ferroelectric material is a first direction $P_1$, for example, a direction from the channel layer to a gate electrode. In FIG. 4, (b) illustrates current characteristics of source-drain due to a channel layer doped with a p-type dopant, when a polarization direction of a ferroelectric material is a second direction $P_2$, for example, a direction from a gate electrode to the channel layer. In FIG. 4, (c) illustrates current characteristics of source-drain due to a channel layer doped with an n-type dopant, when a polarization direction of a ferroelectric material is the first direction $P_1$, for example, a direction from the channel layer to a gate electrode. In FIG. 4, (d) illustrates current characteristics of source-drain due to a channel layer doped with an n-type dopant, when a polarization direction of a ferroelectric material is the second direction $P_2$, for example, a direction from a gate electrode to the channel layer.

When a polarization direction of a ferroelectric material is the first direction $P_1$, in a p-type transistor of the memory cell 10, source-drain current increases as a gate voltage decreases based on the first threshold voltage $V_{th1}$, and in an n-type transistor of the memory cell 10, source-drain current increases as a gate voltage increases based on the first threshold voltage $V_{th1}$. Accordingly, a signal output from the memory cell 10 according to an embodiment, that is, current, may be mirrored based on the first threshold voltage $V_{th1}$.

When a polarization direction of a ferroelectric material is the second direction $P_2$, in a p-type transistor of the memory cell 10, source-drain current increases as a gate voltage decreases based on the second threshold voltage $V_{th2}$, and in an n-type transistor of the memory cell 10, source-drain current increases as a gate voltage decreases based on the second threshold voltage $V_{th2}$. Accordingly, a signal output from the memory cell 10 according to an embodiment, that is, current, may be mirrored based on the second threshold voltage $V_{th2}$.

Because current, that is, an electrical signal, output from the memory cell 10 is mirrored, a separate circuit for mirroring is not required.

In the memory cell 10 according to an embodiment, when a polarization direction of a ferroelectric material is the first direction $P_1$, data "0" may be written through a voltage applied through a search line, and when a polarization direction of a ferroelectric material is the second direction $P_2$, data "1" may be written through a voltage applied through the search line.

In the memory cell 10, when a polarization direction of a ferroelectric material is the first direction $P_1$, data "0" may be read through the first threshold voltage $V_{th1}$ applied through the search line, and when a polarization direction of a ferroelectric material is the second direction $P_2$, data "1" may be read through the second threshold voltage $V_{th2}$ applied through the search line.

Figure 5:
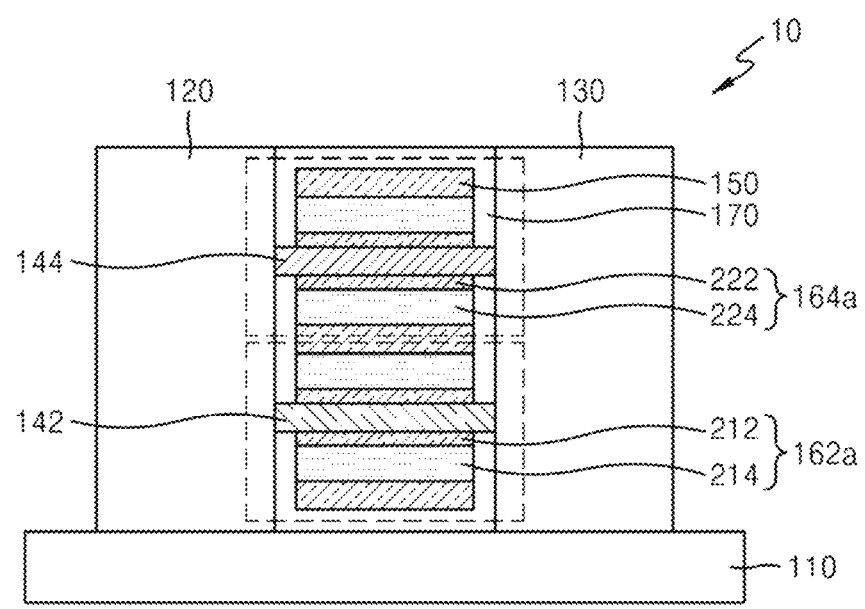
FIG. 5 is a view illustrating a memory cell including a ferroelectric material and a paraelectric material, according to an embodiment.

FIG. 5 is a view illustrating a memory cell 10a including a ferroelectric material and a paraelectric material, according to an embodiment. Comparing FIGS. 2 and 5, first and second gate insulating layers 162a and 164a of the memory cell 10a of FIG. 5 may include first layers 212 and 222 each formed of a paraelectric material and second layers 214 and 224 each formed of a ferroelectric material. The first layers 212 and 222 may be spaced apart from the gate electrode 150 by the second layers 214 and 224, and the second layers 214 and 224 may contact the gate electrode 150.

The first layers 212 and 222 each formed of a paraelectric material may be layers formed by naturally oxidizing a material included in the first and second channel layers 142 and 144. For example, when each of the first and second channel layers 142 and 144 includes Si, each of the first layers 212 and 222 may include SiO. A thickness of each of the first layers 212 and 222 may be equal to or less than a thickness of each of the second layers 214 and 224.

Figure 6A:
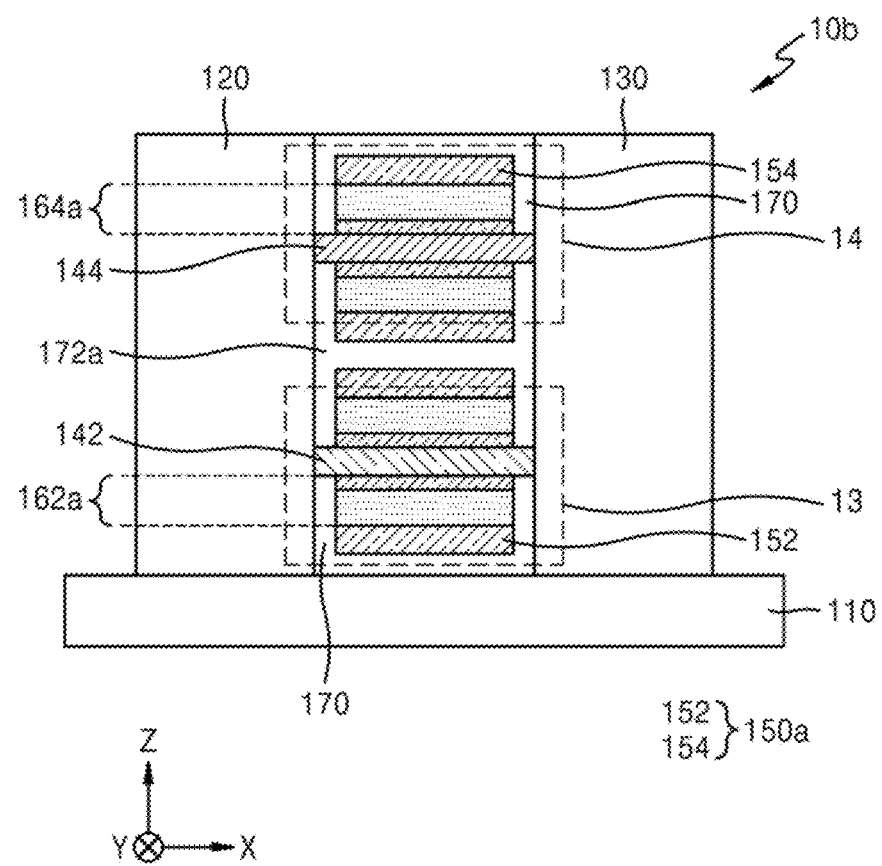
FIG. 6A is a view illustrating a memory cell including a plurality of gate electrodes, according to an embodiment.

FIG. 6A is a view illustrating a memory cell 10b including a plurality of gate electrodes 150a, according to an embodiment. Comparing FIGS. 5 and 6A, a gate electrode 150a of the memory cell 10b of FIG. 6A may include a first gate electrode 152 surrounding the first gate insulating layer 162a and a second gate electrode 154 surrounding the second gate insulating layer 164a. An insulating layer 172a may be located between the first gate electrode 152 and the second gate electrode 154. That is, the gate electrode 150 of FIG. 5 may be one electrode in which the first gate electrode 152 and the second gate electrode 154 contact each other, and the gate electrode 150a of FIG. 6A may include the first gate electrode 152 and the second gate electrode 154 separated by the insulating layer 172a. The insulating layer 172a may include a paraelectric material. For example, the insulating layer may include at least one of, but not limited to, SiO, AlO, SiON, and SiN.

The same voltage or different voltages may be applied to the first gate electrode 152 and the second gate electrode 154. Even when the first channel layer 142 and the second channel layer 144 are doped with dopants at the same concentration in the same base material, a threshold voltage of a p-type transistor and a threshold voltage of an n-type transistor may be different from each other. This is because an electron mobility varies according to a dopant type. Accordingly, in order to more effectively apply an operating voltage, different voltages may be applied to the first gate electrode 152 and the second gate electrode 154.

Figure 6B:
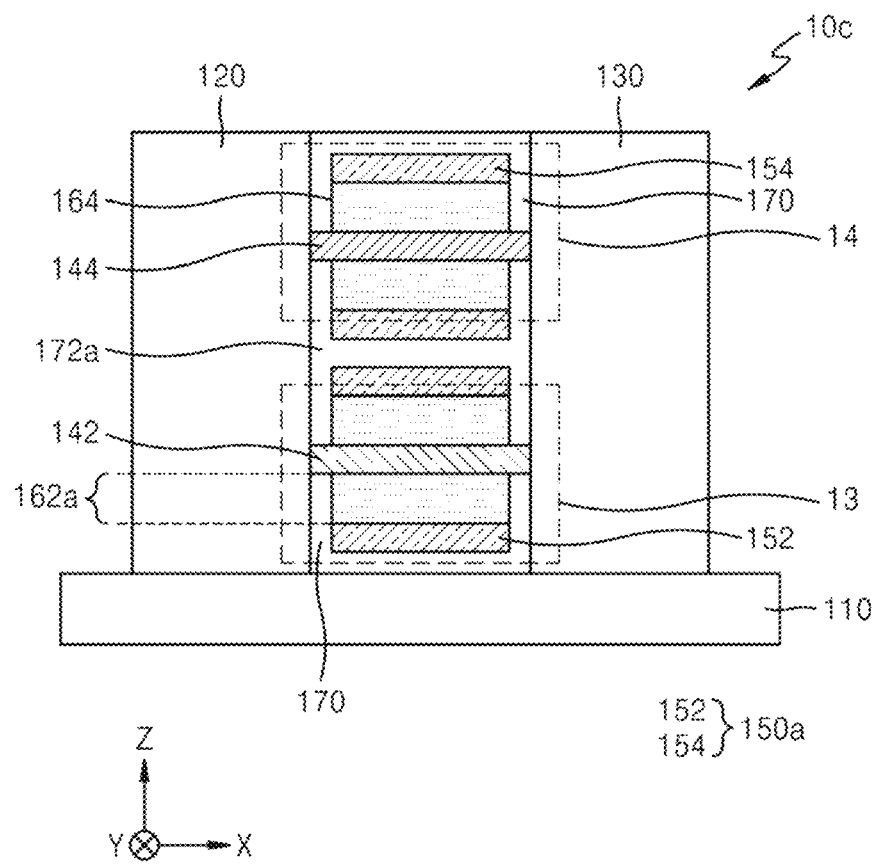
FIG. 6B is a view illustrating a memory cell including a plurality of gate electrodes, according to an embodiment.

FIG. 6B is a view illustrating a memory cell 10c including a plurality of gate electrodes 150a, according to an embodiment. Comparing FIGS. 6A and 6B, the first gate insulating layer 162 and second gate insulating layer 164 may be used in the memory cell 10c instead of the first gate insulating layer 162a and the second gate insulating layer 164a. Unlike the first and second gate insulating layers 162a and 164a, the first and second gate insulating layers 162 and 164 do not have the first layers 212 and 222. As shown in FIG. 6B, in the memory cell 10c, the first gate electrode 152 and the second gate electrode 154 may be separated by the insulating layer 172a.

Figure 7:
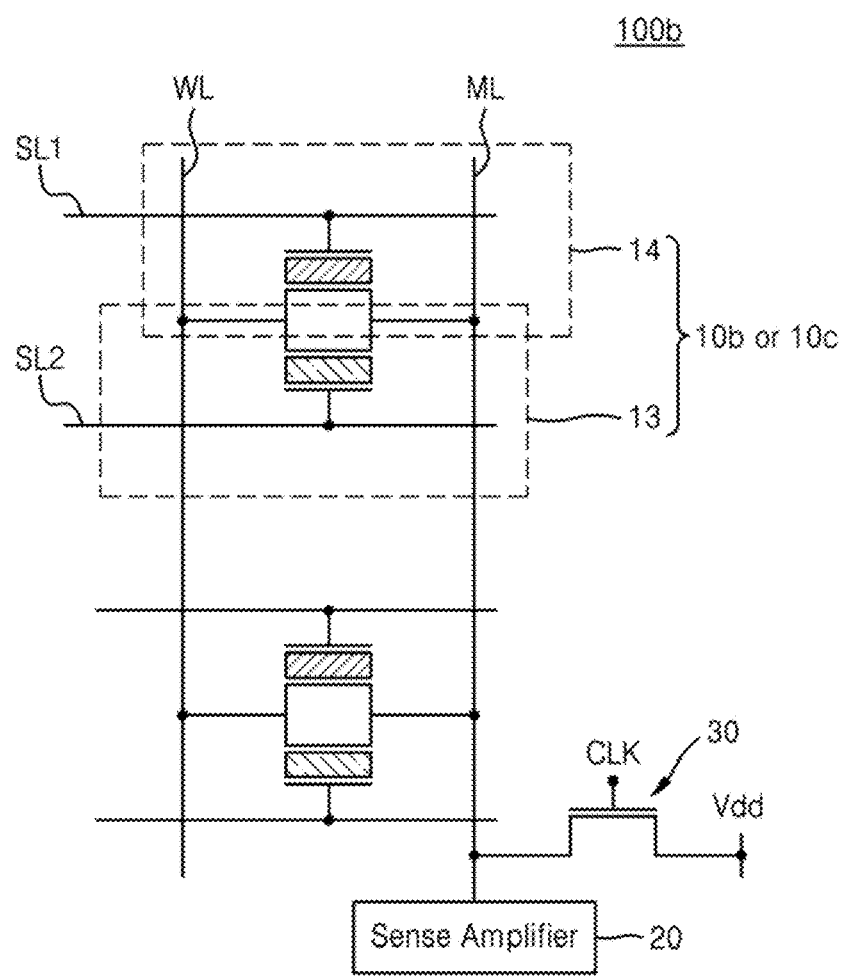
FIG. 7 is a circuit diagram illustrating a content-addressable memory including the memory cell of FIG. 6A or FIG. 6B.

FIG. 7 is a circuit diagram illustrating a content-addressable memory including the memory cell 10b of FIG. 6A or the memory cell 10c of FIG. 6B. As shown in FIG. 7, a plurality of memory cells 10b (or 10c) may constitute a cell array. In an example, each memory cell 10b (or 10c) may include third and fourth transistors 13 and 14. The term 'transistor' may be a field effect transistor. The third and fourth transistors 13 and 14 of the memory cell 10b (or 10c) may reduce the area of the memory cell 10b (or 10c) by sharing the source electrode 120 and the drain electrode 130. For example, the third and fourth transistors 13 and 14 may share the source electrode 120 and the drain electrode 130.

The source electrode 120 of the memory cell 10b may be connected to the first wiring WL, and the drain electrode 130 of the memory cell 10b may be connected to the second wiring ML. The first wiring WL may be a word line, and the second wiring ML may be a match line. The gate electrode 150a of the memory cell 10b may be connected to the third wiring SL. The third wiring SL may be a search line. The third wiring SL may include a first sub-wiring SL1 connected to the first gate electrode 152 and a second sub-wiring SL2 connected to the second gate electrode 154. The same voltage or different voltages having a complementary relationship may be applied to the first sub-wiring SL1 and the second sub-wiring SL2.

Figure 8:
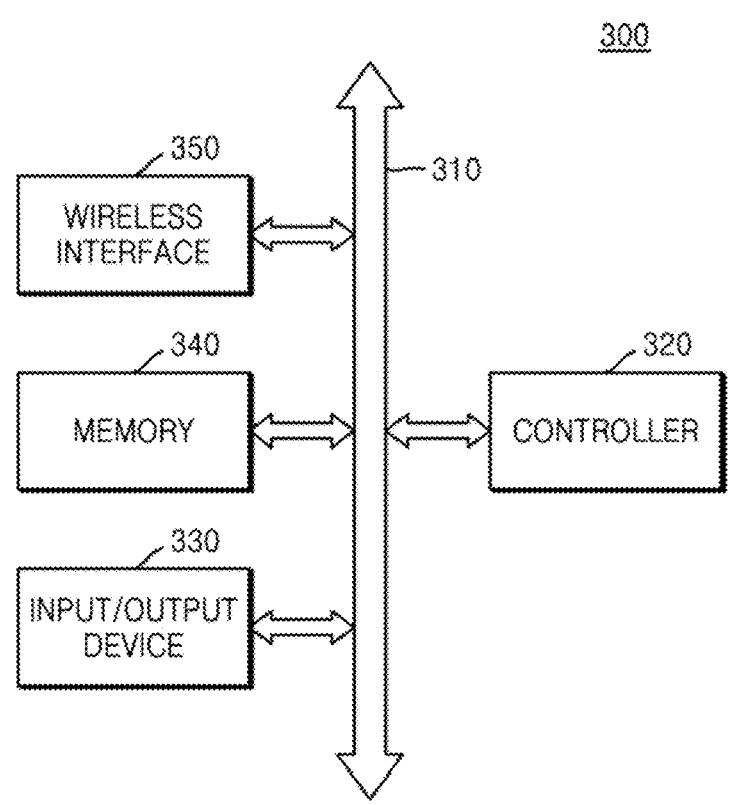
FIG. 8 is a block diagram illustrating an electronic device including a volatile memory, according to an embodiment.

FIG. 8 is a block diagram illustrating an electronic device 300 including a volatile memory, according to an embodiment.

Referring to FIG. 8, the electronic device 300 according to an embodiment may be a PDA, a laptop computer, a portable computer, a web tablet, a wireless phone, a mobile phone, a digital music player, a wired/wireless electronic device, or a composite electronic device including at least two thereof. The electronic device 300 may include a controller 320, an input/output device 330 such as a keypad, a keyboard, or a display, a memory 340, and a wireless interface 350 which are coupled to one another through a bus 310.

The controller 320 may include, for example, at least one microprocessor, digital signal process, micro controller, or the like. The memory 340 may be used to store instructions executed by the controller 320.

The memory 340 may be used to store user data. The memory 340 may include the content-addressable memory 100 of FIG. 1 with one more memory cells 10, and 10a according to FIGS. 2, 3, and 5. Alternatively, or in addition, the memory 340 may include the content-addressable memory 100b of FIG. 7 with one or more memory cells 10b and 10c according to FIGS. 6A and 6B.

The electronic device 300 may use the wireless interface 350 to transmit data or receive data to or from a wireless communication network communicating with an RF signal. For example, the wireless interface 350 may include an antenna, a wireless transceiver, and the like. The electronic device 300 may be used in a communication interface protocol such as a 3G communication system such as CDMA, GSM, NADC, E-TDMA, WCDAM, or CDMA2000, a 4G (4th Generation) communication system, a 5G (5th Generation) communication system, or Long Term Evolution (LTE), a wired local area network (LAN), a wireless local area network (WLAN), such as Wi-Fi (Wireless Fidelity), a wireless personal area network (WPAN), such as Bluetooth, Wireless USB (Wireless Universal Serial Bus), Zigbee, Near Field Communication (NFC), Radio-frequency identification (RFID), and Power Line communication (PLC).

Figure 9:
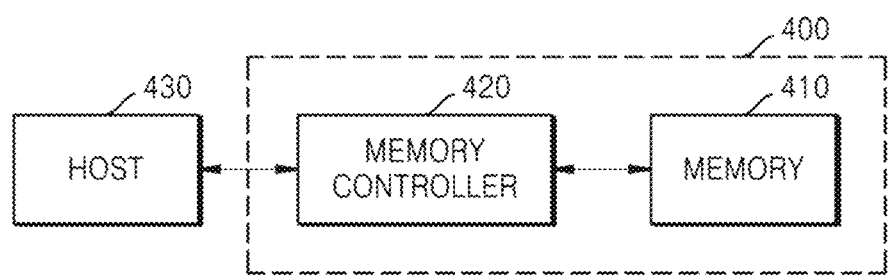
FIG. 9 is a block diagram illustrating a memory system including a volatile memory, according to an embodiment.

FIG. 9 is a block diagram illustrating a memory system 400 including a volatile memory, according to an embodiment.

Referring to FIG. 9, volatile memories according to an embodiment may be used to implement a memory system. The memory system 400 may include a memory 410 for storing a large amount of data and a memory controller 420. The memory controller 420 controls the memory 410 to read or write data from or to the memory 410 in response to a read/write request of a host 430. The memory controller 420 may configure an address mapping table for mapping an address provided from the host 430, for example, a mobile device or a computer system to a physical address of the memory 410. The memory 410 may include the content-addressable memory 100 of FIG. 1 with one more memory cells 10, and 10a according to FIGS. 2, 3, and 5. Alternatively, or in addition, the memory 340 may include the content-addressable memory 100b of FIG. 7 with one or more memory cells 10b and 10c according to FIGS. 6A and 6B.

Figure 10:
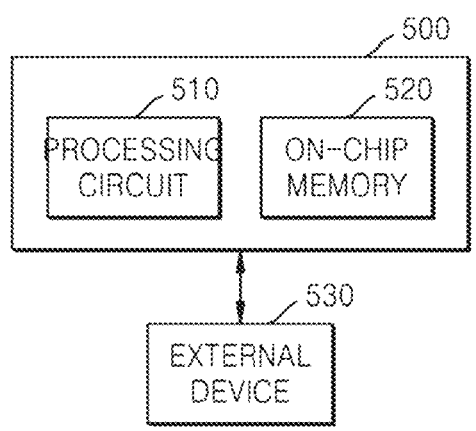
FIG. 10 is a diagram illustrating a neuromorphic device including a memory, according to an embodiment.

The memory according to an embodiment described above may be implemented as a chip and may be used as a neuromorphic computing platform. For example, FIG. 10 schematically illustrates a neuromorphic device including a memory, according to an embodiment. Referring to FIG. 10, a neuromorphic device 500 may include a processing circuit 510 and/or a memory 520. The memory 520 of the neuromorphic device 500 may include the memory system 400 according to an embodiment.

The processing circuit 510 may be configured to control functions for driving the neuromorphic device 500. For example, the processing circuit 510 may control the neuromorphic device 500 by executing a program stored in the memory 520 of the neuromorphic device 500.

The processing circuit 510 may include a hardware such as a logic circuit, a combination of software and hardware such as a processor for executing software, or a combination thereof. Examples of the processor may include a central processing unit (CPU), a graphics processing unit (GPU), an application processor (AP) in the neuromorphic device 500, an arithmetic logic unit (ALU), a digital processor, a microcomputer, a field-programmable gate array (FPGA), a system-on-chip (SoC), a programmable logic unit, a microprocessor, and an application-specific integrated circuit (ASIC).

Also, the processing circuit 510 may read and write various data from and to an external device 1030 and may execute the neuromorphic device 500 by using the data. The external device 1030 may include a sensor array including an image sensor (e.g., a CMOS image sensor circuit) and/or an external memory.

The neuromorphic device 500 of FIG. 10 may be applied to a machine learning system. The machine learning system may include any of various artificial neural networks and processing models including a convolutional neural network (CNN), a deconvolutional neural network, a recurrent neural network (RNN) that selectively includes a long short-term memory (LSTM) and/or a gated recurrent unit (GRU), a stacked neural network (SNN), a state-space dynamic neural network (SSDNN), a deep belief network (DBN), a generative adversarial network (GAN), and/or a restricted Boltzmann machine (RBM).

The machine learning system may include, for example, linear regression and/or logistic regression, statistical clustering, Bayesian classification, decision trees, dimensionality reduction such as principal component analysis, another type of machine learning model such as an expert system, and/or an ensemble method such as random forest. The machine learning model may be used to provide various services such as an image classification service, a biometric information or biometric data-based user authentication service, an advanced driver assistance system (ADAS), a voice assistant service, and an automatic speech recognition (ASR), and may be mounted and executed in another electronic device.

While the volatile memory has been particularly shown and described with reference to embodiments thereof, they are provided for the purposes of illustration and it will be understood by one of ordinary skill in the art that various modifications and equivalent other embodiments may be made from the disclosure. Although many matters have been described in detail in the above description, they should be interpreted as examples of specific embodiments rather than limiting the scope of the disclosure. The scope of the disclosure should not be defined by the above embodiments but should be defined by the following claims.

In the content-addressable memory, because a plurality of channel layers doped with different dopants are arranged in a direction perpendicular to a substrate, the area of the substrate may be reduced.

Because a ferroelectric material is used as a gate insulating material, the number of memory cells 10 may be reduced to 2.

Because the content-addressable memory includes a plurality of channels doped with different dopants, an inverter for mirroring an electrical signal may not be required, and thus, a device may be simplified.

One or more of the elements disclosed above may include or be implemented in processing circuitry such as hardware including logic circuits; a hardware/software combination such as a processor executing software; or a combination thereof. For example, the processing circuitry may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by one of ordinary skill in the art that various changes in form and details may be made therein without departing from the spirit and scope as defined by the following claims.

What is claimed is:

1. A content-addressable memory comprising:
a match line extending in a first direction;
a word line spaced apart from the match line, the word line extending parallel to the first direction;
a search line spaced apart from the match line and the word line; and
a plurality of memory cells respectively connected to the match line, the word line, and the search line,
wherein at least one of the plurality of memory cells includes
a source electrode and a drain electrode spaced apart from each other,
a first channel layer and a second channel layer doped with different dopants, the first channel layer and the second channel layer between the source electrode and the drain electrode such that a first end of the first channel layer and a first end of the second channel layer contact the source electrode and a second end of the first channel layer and a second end of the second channel layer contact the drain electrode, and
a gate electrode spaced apart from all of the first channel layer, the second channel layer, the source electrode, and the drain electrode.

2. The content-addressable memory of claim 1, further comprising:
a substrate,
wherein the source electrode and the drain electrode are located on the substrate and are spaced apart from each other in a direction parallel to a surface of the substrate, and
the first channel layer and the second channel layer are located on the substrate and are spaced apart from each other in a thickness direction of the substrate.

3. The content-addressable memory of claim 1, wherein a ratio of a charge mobility of the second channel layer to a charge mobility of the first channel layer is equal to or greater than 0.9 and equal to or less than 1.1.

4. The content-addressable memory of claim 1, wherein one of the first channel layer and the second channel layer is doped with an n-type dopant, and
an other of the first channel layer and the second channel layer is doped with a p-type dopant.

5. The content-addressable memory of claim 4, wherein a doping concentration of the p-type dopant in the other of the first channel layer and the second channel layer is equal to or greater than a doping concentration of the n-type dopant in the one of the first channel layer and the second channel layer.

6. The content-addressable memory of claim 1, wherein the first channel layer, the second channel layer, or both the first channel layer and the second channel layer comprise at least one of silicon (Si), germanium (Ge), an oxide semiconductor, a group III-V material, a two-dimensional (2D) material, a transition metal dichalcogenide, quantum dots (QDs), and an organic material.

7. The content-addressable memory of claim 1, wherein a base material of the first channel layer and a base material of the second channel layer are a same material.

8. The content-addressable memory of claim 1, wherein the at least one of the plurality of memory cells further comprises:
  a first gate insulating layer surrounding the first channel layer; and
  a second gate insulating layer surrounding the second channel layer,
  wherein the first gate insulating layer and the second gate insulating layer are spaced apart from each other with a portion of the gate electrode therebetween.

9. The content-addressable memory of claim 8, wherein at least one of the first gate insulating layer and the second gate insulating layer comprises a ferroelectric material.

10. The content-addressable memory of claim 9, wherein the ferroelectric material comprises a material represented as $MO_2$, and
  in $MO_2$, where M is Hf, Zr, or a combination thereof, and M is a base material.

11. The content-addressable memory of claim 8, wherein at least one of the first gate insulating layer and the second gate insulating layer further comprises at least one dopant material selected from C, Si, Ge, Sn, Pb, Al, Y, La, Gd, Mg, Ca, Sr Ba, Ti, Zr, Hf, and a combination thereof.

12. The content-addressable memory of claim 8, wherein at least one of the first gate insulating layer and the second gate insulating layer comprises:
  a first layer including a paraelectric material; and
  a second layer including a ferroelectric material.

13. The content-addressable memory of claim 12, wherein the paraelectric material comprises an oxide of a material included in at least one of the first channel layer and the second channel layer.

14. The content-addressable memory of claim 12, wherein the paraelectric material comprises at least one of SiO, AlO, SiON, and SiN.

15. The content-addressable memory of claim 8, wherein the gate electrode comprises:
  a first gate electrode surrounding the first gate insulating layer; and
  a second gate electrode surrounding the second gate insulating layer.

16. The content-addressable memory of claim 15, wherein the first gate electrode and the second gate electrode contact each other.

17. The content-addressable memory of claim 15, wherein the first gate electrode and the second gate electrode are spaced apart from each other by an insulating layer.

18. The content-addressable memory of claim 17, wherein the insulating layer comprises a paraelectric material.

19. The content-addressable memory of claim 1, wherein
  the word line is connected to the source electrode,
  the match line is connected to the drain electrode, and
  the search line is connected to the gate electrode.

20. An electronic device comprising:
  the content-addressable memory of claim 1.

* * * * *